US012592690B2

(12) United States Patent
Niino et al.

(10) Patent No.: US 12,592,690 B2
(45) Date of Patent: Mar. 31, 2026

(54) CONTROL CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shinsuke Niino, Yokohama Kanagawa (JP); Masayuki Ozaki, Kawasaki Kanagawa (JP)

(73) Assignees: KABUSHIKI KAISHA TOSHIBA, Kawasaki (JP); TOSHIBA ELECTRONIC DEVICES & STORAGE CORPORATION, Kawasaki (JP)

( * ) Notice: Subject to any disclaimer, the term of this patent is extended or adjusted under 35 U.S.C. 154(b) by 199 days.

(21) Appl. No.: 18/460,407

(22) Filed: Sep. 1, 2023

(65) Prior Publication Data

US 2024/0283437 A1      Aug. 22, 2024

(30) Foreign Application Priority Data

Feb. 22, 2023    (JP) ................................. 2023-026292

(51) Int. Cl.
*H03K 17/0412*    (2006.01)
*H03K 17/687*    (2006.01)
*H03K 19/0185*    (2006.01)

(52) U.S. Cl.
CPC ... *H03K 17/04123* (2013.01); *H03K 17/6871* (2013.01); *H03K 19/018514* (2013.01)

(58) Field of Classification Search
CPC ......... H03K 17/04123; H03K 17/6871; H03K 19/018514; H03K 17/687; H03K 17/04
See application file for complete search history.

(56) References Cited

U.S. PATENT DOCUMENTS

| | | | |
|---|---|---|---|
| 6,556,407 B2 | 4/2003 | Brando et al. | |
| 7,362,147 B2 * | 4/2008 | Rebholz-Goldmann | .................... |
| | | | H03K 17/164 |
| | | | 327/170 |
| 10,116,292 B2 | 10/2018 | Yokoi et al. | |

FOREIGN PATENT DOCUMENTS

JP          2006-129593 A      5/2006

* cited by examiner

*Primary Examiner* — Metasebia T Retebo
(74) *Attorney, Agent, or Firm* — Knobbe, Martens, Olson & Bear, LLP

(57) ABSTRACT

According to one embodiment, a control circuit includes a capacitive element connected between an output terminal of an output-switching transistor circuit and a control electrode, and a charge circuit charges the capacitive element when the ON/OFF switching signal is switched from an OFF command to an ON command, delay improvement circuit shortens a delay time from OFF to ON of the transistor circuit by setting the ON/OFF control voltage of the transistor circuit to the first switching threshold in conjunction with the operation of the charge circuit.

6 Claims, 3 Drawing Sheets

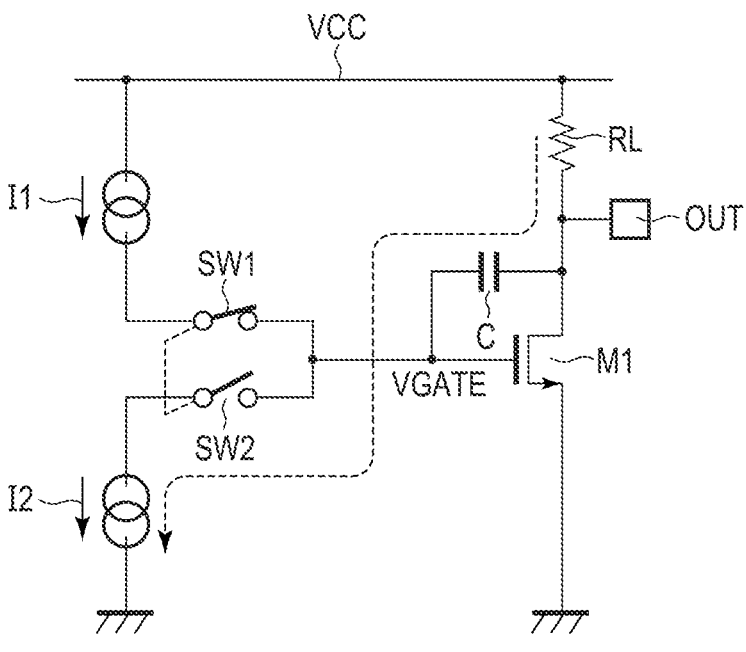
F I G. 1A
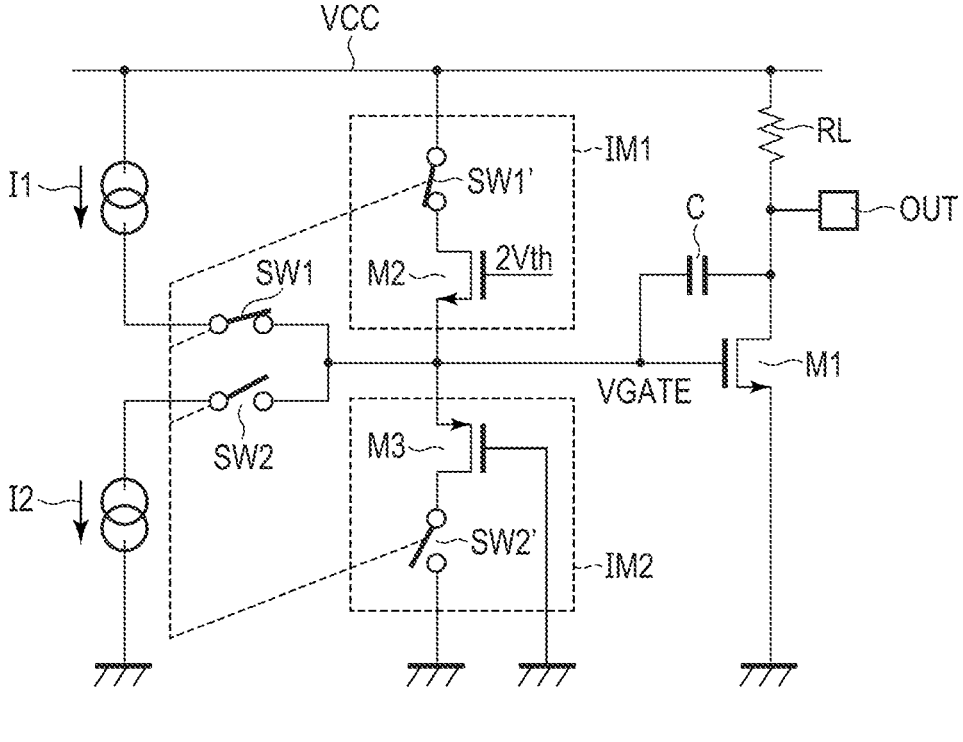
F I G. 1B

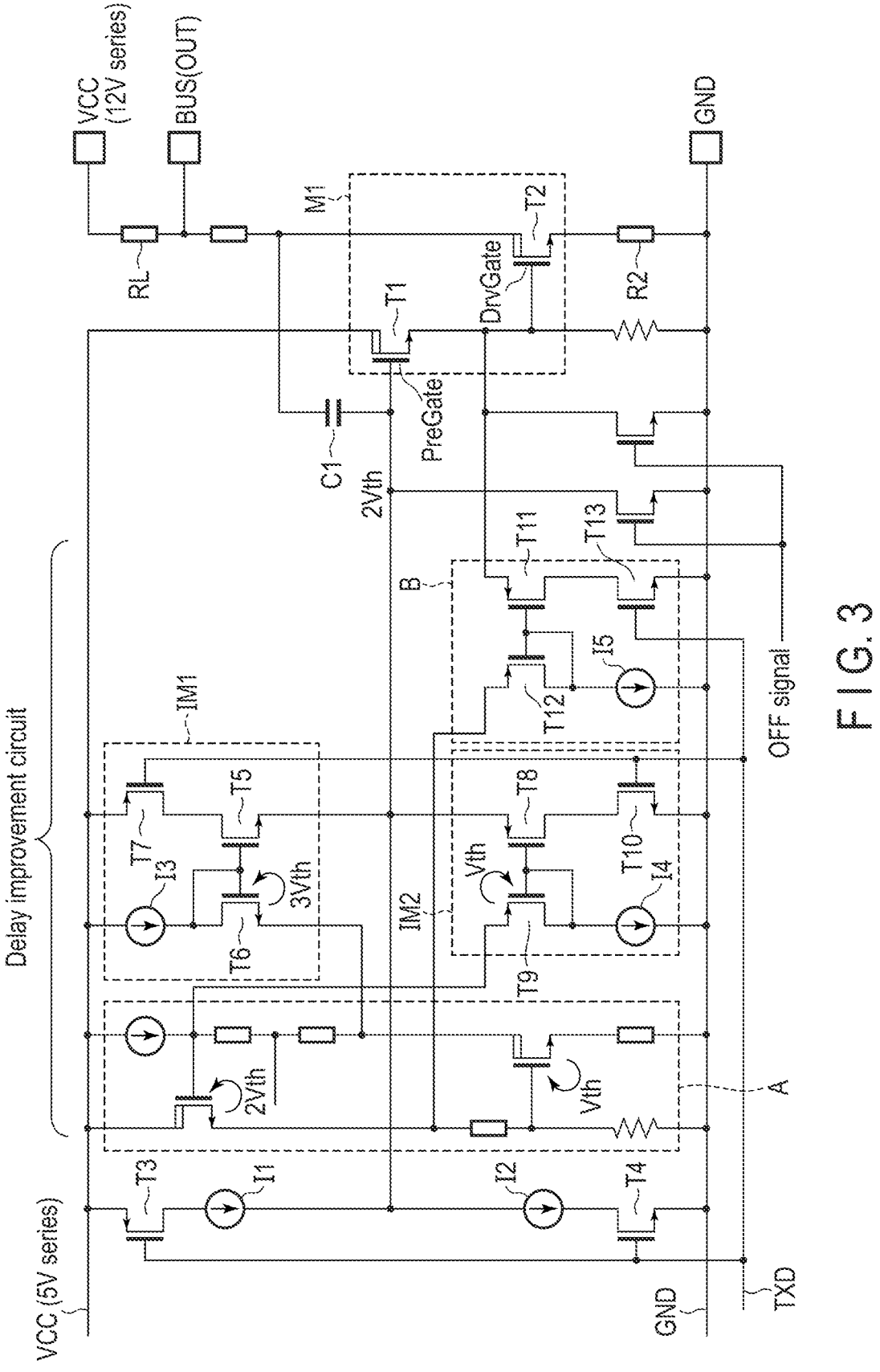
F I G. 3

CONTROL CIRCUIT

CROSS-REFERENCE TO RELATED APPLICATIONS

This application is based upon and claims the benefit of priority from Japanese Patent Application No. 2023-026292, filed Feb. 22, 2023, the entire contents of which are incorporated herein by reference.

FIELD

Embodiments described herein relate generally to a control circuit.

BACKGROUND

In the conventional local interconnect network (LIN) circuit, which is of an in-vehicle communication standard, constant current drive is employed for slew rate control. On the other hand, the new clock extension peripheral interface (CXPI) communication standard involves high speed communications that have been increased, and the delay time caused when switching between dominant and recessive outputs has become a problem.

BRIEF DESCRIPTION OF THE DRAWINGS

FIGS. 1A and 1B are circuit diagrams showing a configuration of a control circuit according to an embodiment and a base circuit configuration of a comparison example, respectively.

FIG. 3 is a circuit diagram showing an example in which the control circuit of the embodiment is applied.

DETAILED DESCRIPTION

Figure 2A:
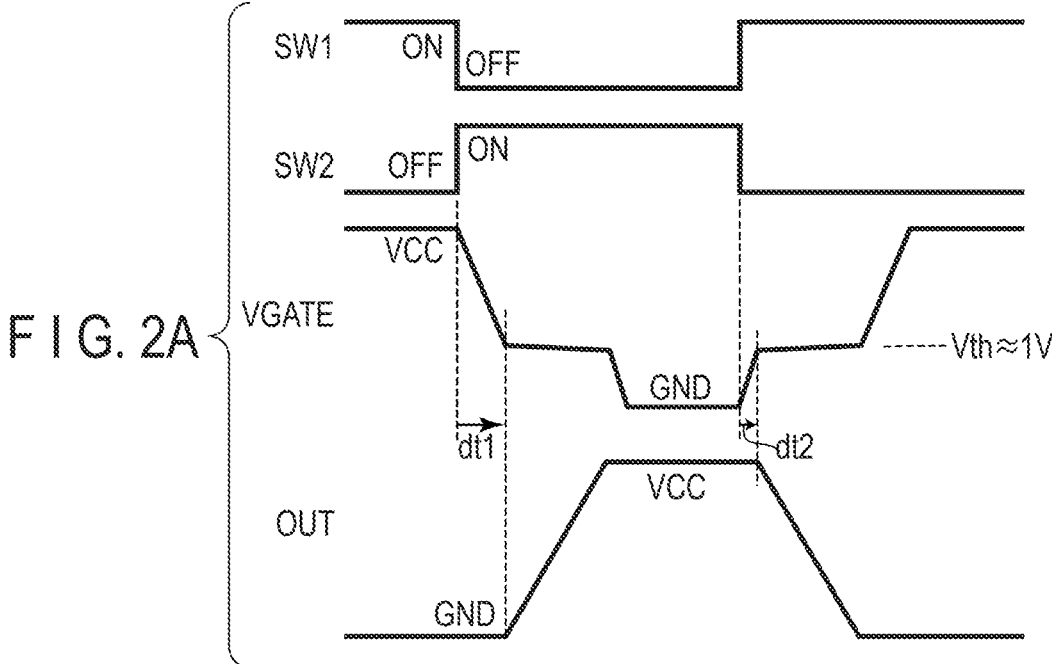
FIGS. 2A and 2B are waveform diagrams for illustrating operations of the control circuits shown in FIGS. 1A and 1B, respectively.

Embodiments will be described hereinafter with reference to the accompanying drawings.

In general, according to one embodiment, a control circuit comprises a capacitive element connected between an output terminal of an output-switching transistor circuit and a control electrode, and a charge circuit charges the capacitive element when the ON/OFF switching signal is switched from an OFF command to an ON command, a discharge circuit discharges the capacitive element when the ON/OFF switching signal is switched from the ON command to the OFF command, a first delay improvement circuit shortens a delay time which occurs when switched from an OFF state to an ON state of the transistor circuit by setting the ON/OFF control voltage of the transistor circuit to the first switching threshold in conjunction with the operation of the charge circuit, and the second delay improvement circuit shortens the delay time which occurs when switched from an OFF state to an ON state of the transistor circuit by setting the ON/OFF control voltage of the transistor circuit to the second switching threshold in conjunction with the operation of the discharge circuit.

Note that in the following descriptions, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

Figure 2B:
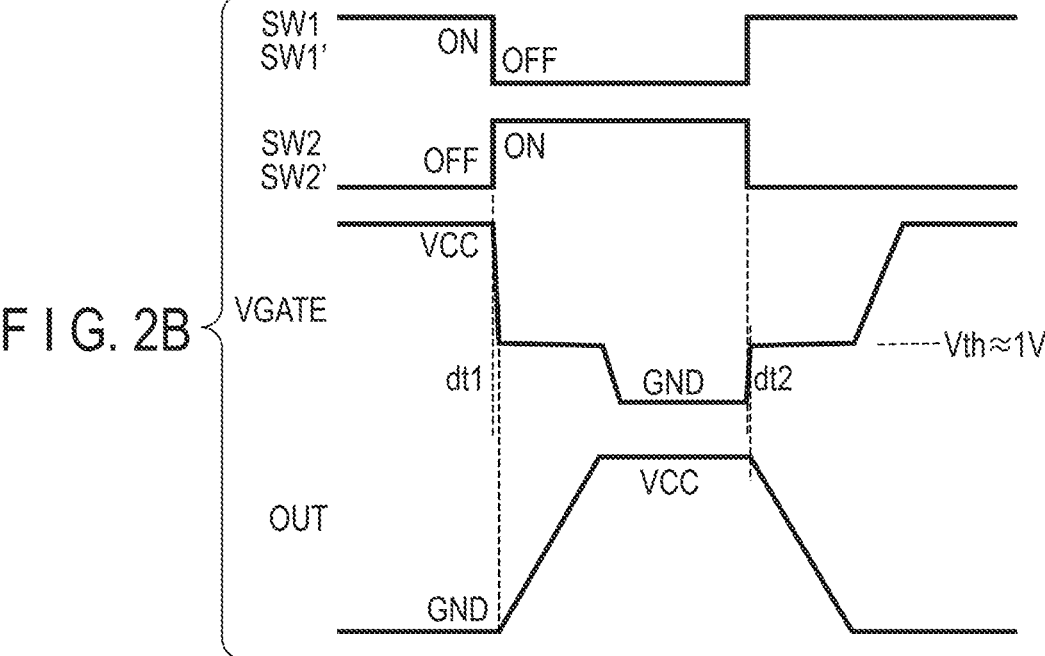

FIGS. 1A and 1B are block diagrams respectively showing a configuration of a control circuit according to the embodiment and a circuit configuration of a comparative example. FIG. 1A shows a base circuit configuration of the control circuit of the comparative example and FIG. 1B shows the configuration in which a delay improvement circuit, which is a feature of the embodiment, is arranged in the base circuit shown in FIG. 1A. FIGS. 2A and 2B are waveform diagrams illustrating the operations of the control circuits shown in FIGS. 1A and 1B, respectively. FIG. 2A shows the operating waveform of the base circuit shown in FIG. 1A and FIG. 2B shows the operating waveform of the control circuit shown in FIG. 1B.

In FIG. 1A, reference numeral M1 denotes a first field effect transistor (FET) (hereinafter referred to as "transistor"), in which a drain electrode is connected to an output terminal OUT and further to a VCC power line via a resistor RL, a source electrode is connected to a GND power line, and a base electrode is connected to a gate electrode via a capacitor C. The gate electrode of the first transistor M1 is connected to another terminal of a first constant current source I1 for charging, one end of which is connected to the VCC power supply line, via a first switch SW1, and also to another end of a second constant current source I2 for discharging, one end of which is connected to the GND power supply line via a second switch SW2.

That is, as shown in FIG. 2A, when the first switch SW1 is ON and the second switch SW2 is OFF, the gate electrode of the first transistor M1 is connected to the first constant current source I1. Thus, the gate voltage VGATE is at a VCC voltage, and the capacitor C is charged to set the first transistor M1 in an ON state. Therefore, the output terminal OUT is at the GND voltage.

From this state, when the first switch SW1 is switched OFF and the second switch SW2 is switched ON, the gate electrode of the first transistor M1 is switched from the first constant current source I1 and connected to the second constant current source I2, and therefore the gate voltage VGATE is at the GND voltage, and the first transistor M1 is set in an OFF state. Therefore, the output terminal OUT is at the VCC voltage.

Then, when the first switch SW1 is switched ON and the second switch SW2 is switched OFF, the gate electrode of the first transistor M1 is switched from the second constant current source I2 and connected to the first constant current source I1. Therefore, the gate voltage VGATE is at the VCC voltage, and the first transistor M1 is set in the ON state. Thus, the output terminal OUT is at the GND voltage.

In the circuit of the comparative example shown in FIG. 1A, a charge time is created in the capacitor C and the first constant current source I1 for the gate electrode of the first transistor M1, and a discharge time is created in the capacitor C and the second constant current source I2 in order to keep the slew rate of the output OUT low.

However, as the speed of control circuits for CXPI communications and the like has increased, a fall delay time dt1 and a rise delay time dt2 that occur when switching between dominant and recessive outputs have become problematic. In other words, if the slew rate is lowered by constant current and capacitance, etc., it takes time for the gate voltage to reach a threshold Vth, thereby increasing the delay time. More specifically, the fall delay time dt1 and the rise delay time dt2 from the time the first transistor M1 is switched from OFF to ON and from ON to OFF by the switching signal (SW-ON/OFF) until the VGATE voltage becomes the threshold Vth (about 1V) are long. Here, it rises a necessity to shorten the delay time.

To solve this, this embodiment employs such a configuration as shown in FIG. 1B that the gate electrode of the first transistor M1 is connected to the VCC power supply line via a dt2 delay improvement circuit IM1 by the second transistor M2 and the first interlocking switch SW1' that is interlocked with the first switch SW1, and also connected to the GND power supply line via the third transistor M3 and a dt1 delay improvement circuit IM2 by a second interlocking switch SW2', which is interlocked with the second switch SW1.

That is, in the control circuit according to this embodiment shown in FIG. 1B, the first interlocking switch SW1' and the second interlocking switch SW2' that turn ON/OFF near the threshold Vth in conjunction with the first switch SW1 and the second switch SW2 for connection to the constant current source are implemented, and when the first interlocking switch SW1' and the second interlocking switch SW2' are turned ON/OFF, the gate voltages of the second transistor M2 and the third transistor M3 are set to be raised and lowered from VGATE to around Vth, respectively. With this configuration, as shown in FIG. 2B, the delay times dt1 and dt2, that is, from the time when the first transistor M1 is switched from OFF to ON and from ON to OFF by the switching signals (ON/OFF of SW1-SW1' and SW2-SW2') to when the VGATE voltage becomes the threshold value Vth, can be shortened.

FIG. 3 is a circuit diagram showing an example in which the control circuit for the embodiment shown in FIG. 1B is applied. In FIG. 3, the members corresponding to the elements or circuits shown in FIG. 1B are denoted by the same reference symbols, respectively.

FIG. 3 is a control circuit in which the output terminal OUT of the embodiment is connected to a BUS of the integrated circuit. The circuit shown in FIG. 3 is configured so that the internal circuit operates on a 5V-series VCC power source and the output is pulled up to a 12V-series VCC power source. In FIG. 3, the first transistor M1 shown in FIG. 1B is constituted by transistors T1 and T2 connected in cascade, and the source electrode of the first-stage transistor T1 serves as a pre-gate (PreGate) and the source electrode of the second-stage transistor T2 serves as a drive gate (DrvGate). The capacitor C shown in FIG. 1B is constituted by a capacitor C1 connected between the gate electrode of the transistor T1 and the source electrode of the transistor T2. The first switch SW1 shown in FIG. 1B is constituted by a transistor T3, and the second switch SW2 is constituted by a transistor T4. As to the dt2 delay improvement circuit IM1 shown in FIG. 1B, the second transistor M2 is constituted by a current mirror circuit of transistors T5 and T6 and a constant current source I3, and the first interlocking switch SW1' is constituted by the transistor T7. As to the dt1 delay improvement circuit IM2 shown in FIG. 1B, the third transistor M2 is constituted by a current mirror circuit of transistors T8 and T9 and a constant current source I4, and the second interlocking switch SW2' is constituted by a transistor T10.

Note that in FIG. 3, a block A is a circuit that fine-adjusts the respective gate voltages of the transistor T5 corresponding to the second transistor M2 and the transistor T8 corresponding to the third transistor M3 with constant current and resistance so that the set specified slew rate is not affected in the first constant current source I1 and the first switch SW1. Further, a block B is a circuit that improves the delay time with respect to the drive gate of the second stage transistor T2 with a similar intention to that of the dt1 delay improvement circuit IM2, which is constituted by the third transistor M3 and the second interlocking switch SW2'. Here, the part corresponding to the third transistor M3 is constituted by a current mirror circuit of the transistor T11 and T12 and the constant current source I5, and the part corresponding to the second interlocking switch SW2' is constituted by the transistor T13. In this configuration, the drive gate is located ahead of the pre-gate, and therefore the threshold is higher by Vth than the circuit of the embodiment shown in FIG. 1B.

In the example discussed above, the transistor T7 (corresponding to the first interlocking switch SW1'), which is turned ON and OFF near the threshold value 3Vth in conjunction with the transistor T3 (corresponding to the first switch SW1) and the transistor T4 (corresponding to the second switch SW2), and transistors T10 and T13 (corresponding to the second interlocking switch SW2') are implemented, and when the transistors T7, T10 and T13 are turned ON and OFF, the gate voltages of the transistors T5, T8 and T11 are set to be raised and lowered from the VGATE to around Vth, respectively. With this configuration, the delay time, that is, from the time when the transistors T1 and T2 are switched from OFF to ON and from ON to OFF by the switching signals (ON/OFF of SW1-SW1' and SW2-SW2' in FIG. 1A) TXD, to when the gate voltage becomes the threshold value Vth, can be shortened.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A control circuit comprising:
   a transistor circuit which switches a voltage at an output terminal between a first voltage and a second voltage different from the first voltage according to an ON/OFF control voltage supplied to a control electrode;
   a capacitive element connected between the output terminal of the transistor circuit and the control electrode;
   a charge circuit which charges the capacitive element when an ON/OFF switching signal that generates the ON/OFF control voltage is switched from an OFF command to an ON command; and
   a delay improvement circuit which sets the ON/OFF control voltage to a switching threshold in conjunction with operation of the charge circuit, thereby shortening a delay time of the transistor circuit which occurs when switched from an OFF state to an ON state.

2. The control circuit of claim 1, wherein the delay improvement circuit comprises a switch element that turns ON and OFF in response to the ON/OFF switching signal, and a current adjustment circuit that adjusts a charge current to the capacitive element so that the ON/OFF control voltage is set to the switching threshold when the switch element is switched from an OFF state to an ON state by the ON/OFF switching signal.

3. A control circuit comprising:

a transistor circuit which switches a voltage at an output terminal between a first voltage and a second voltage different from the first voltage according to an ON/OFF control voltage supplied to a control electrode;

a capacitive element connected between the output terminal of the transistor circuit and the control electrode;

a discharge circuit which discharges the capacitive element when an ON/OFF switching signal that generates the ON/OFF control voltage is switched from an ON command to an OFF command; and a delay improvement circuit which sets the ON/OFF control voltage to a switching threshold in conjunction with operation of the discharge circuit, thereby shortening a delay time of the transistor circuit which occurs when switched from an ON state to an OFF state.

4. The control circuit of claim 3, wherein the delay improvement circuit comprises a switch element that turns ON and OFF in response to the ON/OFF switching signal, and a current adjustment circuit that adjusts a discharge current to the capacitive element so that the ON/OFF control voltage is set to the switching threshold when the switch element is switched from an OFF state to an ON state by the ON/OFF switching signal.

5. A control circuit comprising:

a transistor circuit which switches a voltage at an output terminal between a first voltage and a second voltage different from the first voltage according to an ON/OFF control voltage supplied to a control electrode;

a capacitive element connected between the output terminal of the transistor circuit and the control electrode;

a charge circuit which charges the capacitive element when an ON/OFF switching signal that generates the ON/OFF control voltage is switched from an OFF command to an ON command;

a discharge circuit which discharges the capacitive element when an ON/OFF switching signal that generates the ON/OFF control voltage is switched from an ON command to an OFF command;

a first delay improvement circuit which sets the ON/OFF control voltage to a switching threshold in conjunction with operation of the charge circuit, thereby shortening a delay time of the transistor circuit which occurs when switched from an OFF state to an ON state; and a second delay improvement circuit which sets the ON/OFF control voltage to a switching threshold in conjunction with operation of the discharge circuit, thereby shortening a delay time of the transistor circuit which occurs when switched from the ON state to the OFF state.

6. The control circuit of claim 5, wherein the first delay improvement circuit comprises a first switch element which turns ON and OFF in response to the ON/OFF switching signal, and a first current adjustment circuit which adjusts a charge current of the capacitive element so that the ON/OFF control voltage is set to the first switching threshold when the first switch element is switched from an OFF state to an ON state by the ON/OFF switching signal, and the second delay improvement circuit comprises a second switch element which turns ON and OFF in response to the ON/OFF switching signal, and a second current adjustment circuit that adjusts a discharge current of the capacitive element so that the ON/OFF control voltage is set to the second switching threshold when the second switch element is switched from the ON state to the OFF state by the ON/OFF switching signal.

* * * * *